(12) United States Patent
Jia et al.

(10) Patent No.: US 10,278,313 B2
(45) Date of Patent: Apr. 30, 2019

(54) MODULAR ELECTRONIC DEVICE AND HEAD UNIT FOR VEHICLES

(71) Applicant: Harman International Industries, Incorporated, Stamford, CT (US)

(72) Inventors: David Jia, Houston, TX (US); Valod Noshadi, Ettlingen (DE); Homero Garza, Wixom, MI (US); Alex Tzinares, Ann Arbor, MI (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 11 days.

(21) Appl. No.: 15/714,858

(22) Filed: Sep. 25, 2017

(65) Prior Publication Data

US 2019/0098800 A1    Mar. 28, 2019

(51) Int. Cl.

| H05K 1/02 | (2006.01) |
|---|---|
| H05K 5/00 | (2006.01) |
| H05K 7/20 | (2006.01) |
| H05K 9/00 | (2006.01) |
| H05K 1/14 | (2006.01) |
| H05K 7/14 | (2006.01) |
| B60K 37/02 | (2006.01) |

(52) U.S. Cl.
CPC ......... *H05K 9/0007* (2013.01); *H05K 1/0203* (2013.01); *H05K 1/144* (2013.01); *H05K 5/0004* (2013.01); *H05K 5/0017* (2013.01); *H05K 5/0021* (2013.01); *H05K 7/1427* (2013.01); *H05K 7/20218* (2013.01); *H05K 7/20409* (2013.01); *B60K 37/02* (2013.01); *B60K 2350/302* (2013.01); *H05K 2201/042* (2013.01)

(58) Field of Classification Search
CPC .................................................. H05K 5/0021
See application file for complete search history.

(56) References Cited

U.S. PATENT DOCUMENTS

| 4,771,365 | A | * | 9/1988 | Cichocki | H05K 7/1421 165/80.3 |
|---|---|---|---|---|---|
| 6,142,301 | A | * | 11/2000 | Lin | H05K 5/0021 206/511 |
| 8,009,435 | B2 | * | 8/2011 | Metzger | H05K 7/1429 361/704 |
| 8,842,437 | B2 | * | 9/2014 | Chang | G06F 1/181 165/185 |

\* cited by examiner

*Primary Examiner* — Robert J Hoffberg
(74) *Attorney, Agent, or Firm* — Gordon & Rees LLP

(57) ABSTRACT

The present disclosure relates to electronic devices and configurations. In one embodiment, an electronic device includes a plurality of circuit boards and a plurality of chassis enclosures. Each of the plurality of circuit boards is separately housed by a chassis enclosure. Each chassis enclosure includes a front housing and a back housing, the front housing and back housing configured to retain a circuit board, and at least one heat dissipation element. The plurality of chassis enclosures are mounted to provide an air gap for heat dissipation between each chassis enclosures. Each chassis enclosure electrically shields a retained circuit board.

19 Claims, 4 Drawing Sheets

MODULAR ELECTRONIC DEVICE AND HEAD UNIT FOR VEHICLES

FIELD

The present disclosure relates to electronic devices, and more particularly to electronic devices, configurations and methods including features and elements for shielding electromagnetic interference and thermal management.

BACKGROUND

Conventional packaging of electronic devices for vehicle head units often houses electronic devices in a single enclosure due to cost and spacing. In some cases multiple head units may be separately located (e.g., front and rear compartments of a vehicle). In some cases, the conventional designs do not provide adequate thermal management. By way of example, some conventional designs can lead to heat transfer from a head unit to operator input interfaces above allowed temperature tolerances of a user. Similarly, the single enclosure may prevent adequate heat transfer for components within a head unit. Another drawback relates to shielding of electronic components. Electronic components can be affected by electromagnetic sources within the head unit, connections to a head unit or by vehicle components in proximity to a head unit, such as a heater motor, car computer, etc. Extraneous noise within a vehicle can negatively degrade the performance of a head unit and can require expensive redesign of a vehicle in order to remove or address sources of noise.

There is a desire for improved electronic devices and head unit configurations. There also exists a desire for improved thermal management and shielding of electromagnetic interference.

BRIEF SUMMARY OF THE EMBODIMENTS

Disclosed and claimed herein are electronic devices and configurations. One embodiment is directed to an electronic device including a plurality of circuit boards and a plurality of chassis enclosures. Each of the plurality of circuit boards is separately housed by a chassis enclosure. Each chassis enclosure includes a front housing and a back housing, the front housing and back housing configured to retain a circuit board, and at least one heat dissipation element. The plurality of chassis enclosures are mounted to provide an air gap for heat dissipation between each chassis enclosure. Each chassis enclosure electrically shields a retained circuit board.

In one embodiment, each chassis enclosure is structurally connected to another chassis enclosure by fastening elements.

In one embodiment, the front housing and back housing of a chassis enclosures is configured to operate as a Faraday cage to provide EMI shielding for a circuit board retained within the front and back housing.

In one embodiment, the front housing and the back housing of each enclosure includes a ground connection along an outer periphery of a retained circuit board.

In one embodiment, each chassis enclosure is mounted in at least one of a vertical arrangement and horizontal arrangement.

In one embodiment, each chassis enclosure is formed of a heat sinking material and wherein one or more heat spreading elements of the chassis enclosure extends into an air gap between chassis enclosures.

In one embodiment, the electronic device is a head unit for a vehicle and circuit boards of the electronic device are modules for at least one of a media player, navigation unit, radio, communications unit and vehicle interface unit.

In one embodiment, the electronic device also includes a display, wherein the display is mounted to one of the chassis enclosures, and wherein mounting of the display provides an air gap between the display and a chassis enclosure.

In one embodiment, the electronic device also includes a liquid cooled element for at least one of the chassis enclosures.

In one embodiment, the electronic device also includes a main chassis element including a first side structurally connected to the plurality of chassis enclosures and a second side structurally supporting a display, wherein the main chassis element provides shielding of at least one of heat and electromagnetic interference.

Another embodiment is directed an electronic device including a display, a plurality of circuit boards, a main chassis element configured to support the display, and a plurality of chassis enclosures. Each of the plurality of circuit boards is separately housed by a chassis enclosure. Each chassis enclosure includes a front housing and a back housing, the front housing and back housing configured to retain a circuit board, and at least one heat dissipation element. The plurality of chassis enclosures are mounted to provide an air gap for heat dissipation between each chassis enclosure. Each chassis enclosure electrically shields a retained circuit board.

Other aspects, features, and techniques will be apparent to one skilled in the relevant art in view of the following detailed description of the embodiments.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE EXEMPLARY EMBODIMENTS

Overview and Terminology

Figure 1B:
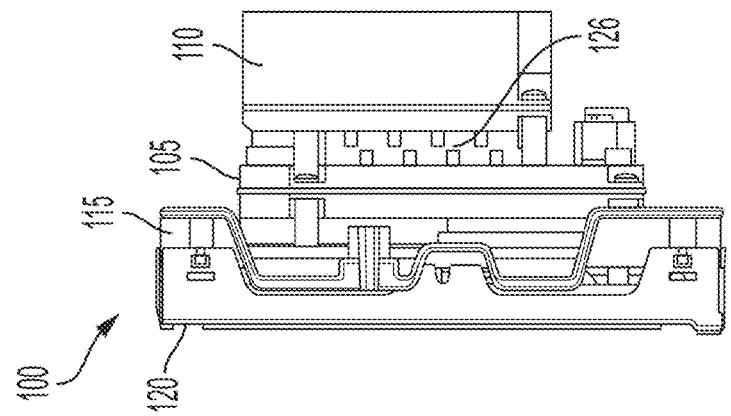
FIGS. 1A-1C depict graphical representations of an electronic device according to one or more embodiments.

One aspect of the disclosure is directed to electronic devices, and more particularly to modular configurations for electronic devices. In one embodiment, modular configurations discussed herein provide configurations with improved thermal management and shielding of electromagnetic interference (EMI). According to another embodiment, configurations allow for use in vehicles, such as automobiles, motorcycles, trucks, boats and other electronic devices which may include multiple circuit boards or modules.

In one embodiment, a modular configuration is provided including a plurality of chassis enclosures. Modules may relate to divisions of electronic components associated with one or more functions. Modules may separate components to shield the components and to improve thermal management. Modules may be provided by chassis enclosures that house individual or multiple circuit boards. Unlike a rectangular or box metal housing which just provides a housing for elements, modules are configured to shield components, provide thermal management, allow for mounting in compressed areas and allow for mounting in close proximity to interface components without transferring heat to the interface.

One embodiment is directed to vehicle head units. A vehicle head unit may include electronic components for entertainment/media playback and to provide one or more vehicle services to an operator. A vehicle head unit often relates to dash or console mounted radio/media player of an automobile. As used herein, a vehicle head unit may relate to electronic components housed in a front console or dashboard area, non-dashboard area, or vehicle compartment in general for one or more of automobiles, motorcycles, trucks, commercial vehicles, work vehicles, etc. According to one embodiment, the electronic device described herein relates to a modular automotive infotainment head unit for providing one or more of a vehicle interface (e.g., touch screen display, controls), navigation, entertainment/multimedia, driver assistance, web browser, communications, etc.

Other embodiments are directed to electronic devices that may be employed in vehicles and non-head unit applications of electronic devices for mounting and use of components in environments where thermal management and EMI shielding is necessary or desired.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment," "certain embodiments," "an embodiment," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation.

Exemplary Embodiments

Figure 1A:
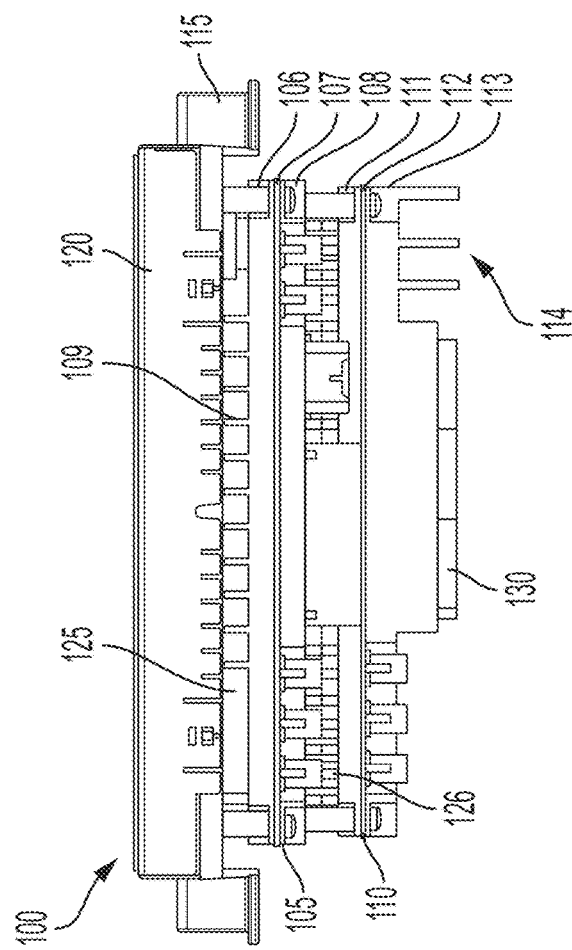
Figure 1C:
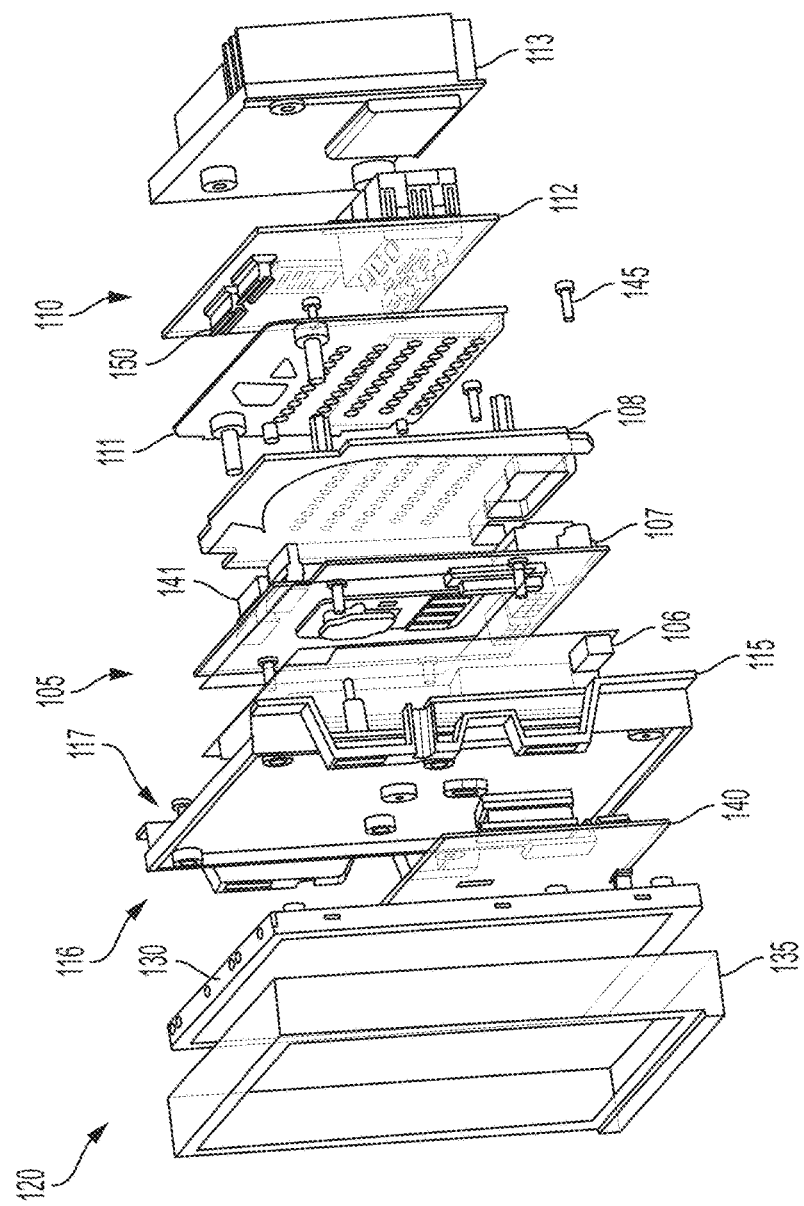

Referring now to the figures, FIGS. 1A-1C depict graphical representations of an electronic device according to one or more embodiments. According to one embodiment, electronic device 100 is configured with a modular design to provide improved thermal cooling for circuit boards of the electronic device. The modular design may also provide improved shielding of circuit boards compared to unshielded arrangements. According to one embodiment, device 100 relates to a vehicle head unit. According to another embodiment, device 100 relates to a vehicle infotainment unit configured to include components for at least one of communication, entertainment, operator interface, driver assistance, guidance and navigation. Device 100 may provide one or more functionalities associated with one or more functional units of a vehicle. Although device 100 is described as being associated with a vehicle head unit, it should be appreciated that the principles discussed herein may be applied to other devices and are not limited to vehicle head units. For example, device 100 is described as a head unit, which may typically be associated with a vehicle. However, configurations of device 100 are not limited to vehicle devices and are not limited placement in a dashboard or vehicle console. Additionally, device 100 may include additional or separate functions than media playback associated with head units and may include one or more circuit boards to provide at least one function. Electronic device 100 may be a head unit for a vehicle and circuit boards of electronic device 100 may be modules for at least one of a media player, navigation unit, radio, communications unit and vehicle interface unit.

According to one embodiment, device 100 includes a modular configuration for each circuit board and device 100 may include a plurality of circuit boards. By way of example, each circuit board may be separately housed in a separate module. In certain embodiments, each module includes one circuit board. In other embodiments, each module can include at least one circuit board. As shown in FIGS. 1A-1C, device 100 includes multiple modules. In addition to multiple modules, device 100 may include one or more additional features. A circuit board of device 100 may relate to one or more electrical components shared on a single structure, such as a printed circuit board (PCB) or other circuit platforms.

Referring to FIG. 1A, device 100 includes module 105 and module 110, which may be components of the device. Module 105 and module 110 may each include at least one circuit board. In certain embodiments, module 105 includes one circuit board and module 110 includes one circuit board. Although device 100 is described as including module 105 and module 110, it should be appreciated that modular configuration described herein can include one or more additional modules.

According to one embodiment, each module of device 100 may include a chassis enclosure. According to another embodiment, each chassis enclosure includes a front housing and a back housing to retain a circuit board. By way of example, device 100 includes module 105 including front housing 106 and back housing 108 forming a chassis enclosure for circuit board 107. Similarly, module 110 includes front housing 111 and back housing 113 forming a chassis enclosure for circuit board 112. Chassis enclosures of device 100 may include one or more elements that enclose circuit elements and allow for mounting and securing the enclosure to one or more other enclosures or housing elements. According to one embodiment, each chassis enclosure is structurally connected to another chassis enclosure by fastening elements, such as screws, bolts, threaded connectors, connection pins, etc.

According to one embodiment, device 100 is configured with a structure that allows for modules 105 and 110 to be connected with one or more air gaps between chassis enclosures to allow for heat dissipation. According to another embodiment, each module of device 100 may include one or more heat dissipation elements. In an exemplary embodiment, device 100 and modules 105 and 110 may include one or more heat displacement elements, such as heat spreaders 109 within an air gap, such as air gap 125. Air gaps provided by electronic device 100 may provide space between modules for thermal convection (e.g., natural or forced) and increase surface area of the modules to transfer heat in an integrated automotive infotainment head unit.

According to one embodiment, modules 105 and 110 of device 100 have a similar structure, such as a substantially planar configuration, wherein module 105 and 110 are joined in an overlapping arrangement along a major face. By way of example, the back housing 108 of module 105 is positioned close to the front housing 111 of module 110, such that one or more air gaps are provided between module 105 and 110. According to another embodiment, modules 105 and 110 may be secured to a main housing 115. Main housing 115 may be a structural element configured to support a plurality of modules on one side. According to another embodiment main housing 115 may be configured to support display 120. Main housing 115 may be a main chassis element including a first side structurally connected to the plurality of chassis enclosures and a second side structurally supporting display 120. Main housing 115 may provides shielding of at least one of heat and electromagnetic interference. As will be discussed herein, device configurations may employ a front housing a lead chassis module, such as front housing 106 to support a module on one side and support a display on the other side. Main housing 115 may allow for mounting device 100 to a supporting structure, such as a vehicle component (e.g., frame, console, dashboard, etc.). The configuration and principles of electronic device 100 does not require coupling to a display.

According to embodiment, electronic device 100 includes a plurality of chassis enclosures that are each mounted to provide an air gap for heat dissipation. Air gap 125 is provided between display 120 and main housing 115. Similarly, air gap 126 is provided between module 105 and module 110, and in particular between back housing 108 and front housing 111. Air gaps between chassis enclosures and housings can provide air flow for heat dissipation. Display 120 may be mounted to one of the chassis enclosures with an air gap between the display and a chassis enclosure.

According to another embodiment, one or more elements of electronic device 100 provide electrical shielding of circuit elements, such as circuit boards 107 and 112. According to one embodiment, each chassis enclosure is configured to shield a circuit board. According to another embodiment, one or more housing elements may shield circuit boards.

According to one embodiment, at least one chassis enclosure of device 100 is configured to provide electromagnetic interference (EMI) shielding to components within the enclosure. The chassis enclosures may provide a Faraday cage for circuit boards. The chassis enclosures of device 100 may be formed of metallic or other materials to prevent EMI interference between other electrical components of a vehicle and the enclosed circuit board. The EMI shielding of device 100 can shielding circuit boards from interference from automotive elements such as motors, vehicle actuator, etc. Each chassis enclosure may electrically shield elements in retained circuit board and allow for external connections. Plug elements of a circuit board, such as connection interface 130 out of back housing 113 of module 110 may extend beyond the chassis enclosure to allow for connection to one or more other devices or components. According to one embodiment, chassis enclosures of device 100 may be formed of one or more materials to provide EMI shielding, including but not limited to aluminum (e.g., die-cast, extruded, forged, etc.), magnesium (e.g., die-cast, extruded, forged, etc.), and steel (e.g., cold-rolled sheet metal, etc.). Chassis enclosures of device 100 may be formed with or without gasket materials.

According to one embodiment, chassis enclosures of device 100 may be formed of one or more materials, such as a heat sinking material, to provide thermal management. Chassis enclosures may retain a circuit board and transfer heat from the enclosure to one or more air gaps between modules. Chassis enclosures of device 100 may include heat spreaders, such as heat spreaders 109 and heat spreaders 114, which extend form either a front housing or back housing of the chassis enclosure for heat dissipation.

As will be discussed in more detail below, one or more of the chassis enclosures and circuit boards may be connected to ground contacts integrated within each chassis enclosure.

FIG. 1 A represents a top down representation of electronic device with modules arranged in parallel with display 120. Each chassis enclosure is mounted in a vertical arrangement (e.g., in parallel with display 120). In other embodiments, each chassis enclosure is mounted in a horizontal arrangement (e.g., perpendicular to display 120).

In FIG. 1B, an alternate view is shown of electronic device 100. The presentation of device 100 in FIG. 1B may be a side profile representation. FIG. 1B depicts display 120 mounted to lead side of main housing 115 and a plurality of modules (module 105 and module 110) mounted to a trailing side of main housing 115. In use, electronic device 100 may be coupled to a support or vehicle structure such as a console or dash with display 120 facing vehicle passengers. Modules 105 and 110 may be within the vehicle structure which may be a compartment within limited airflow. One or more air gaps in electronic device 120, such as air gap 125 between module 105 and 110 may allow for improved air flow and heat convection to occur. Electronic device 100 may include one or more air gaps not shown in FIG. 1B.

Electronic device 100 includes one or more features described herein, such as a modular design which can provide improved thermal cooling and EMI shielding for electrical components such as circuit boards of the device. It should also be appreciated that the modular design described herein allows for a compact design and use of material to meet weight requirements for use in a vehicle. Further to being compact, the structure provided allows for thermal cooling while still meeting the requirements for use in a vehicle, such as automobile.

In FIG. 1C, a disassembled view is shown for electronic device 100 according to one or more embodiments. As described above, electronic device 100 includes module 105 having circuit board 108 and module 110 having circuit board 112. Module 105 includes a chassis enclosure provided by front housing 106 and back housing 108 for circuit board 107. Similarly, module 110 includes a chassis enclosure provided by front housing 111 and back housing 113 for circuit board 112. According to one embodiment, modules 105 and 110 may be fastened trailing side 117 of main housing 115 by one or more fasteners, such as fastener 145. According to another embodiment, leading side 116 of main housing 115 may supply display 120. Main housing 115 supports display 130, display cover 135 and cover plate 140.

According to one embodiment, chassis enclosures of modules 105 and 110 provide EMI shielding for circuit boards and also provide surface areas configured for heat dissipation to air gaps. According to another embodiment, chassis enclosures may include openings for shielded terminals, such as terminal 141 of circuit board 107 and terminal 150 of circuit board 112 that allow for coupling of electronic components.

Although device 100 is shown and described as including the elements described above, it should be appreciated that other elements may be included or added according to one or more other embodiments. By way of example, electronic device may include fasteners in addition to fastener 145. In addition, one or more cables to connections may be made to electronic device 100. According to another embodiment, principles of the disclosure may be provided to other structures with different shapes and features. By way of example, features described herein may be applied to electronic head units that do not include a main housing 115. Alternatively, features and elements described herein could be employed on an electronic device that is not mounted in proximity to the display, such as an infotainment unit with a flip out display or remotely located display.

According to yet another embodiment, electronic device configurations may not require main housing 115 and front housing 106. In certain embodiments, modules 105 may utilize main housing 115 as a front housing for circuit board 107, such that main housing 115 and back housing 108 form a chassis enclosure for circuit board 107.

Figure 2:
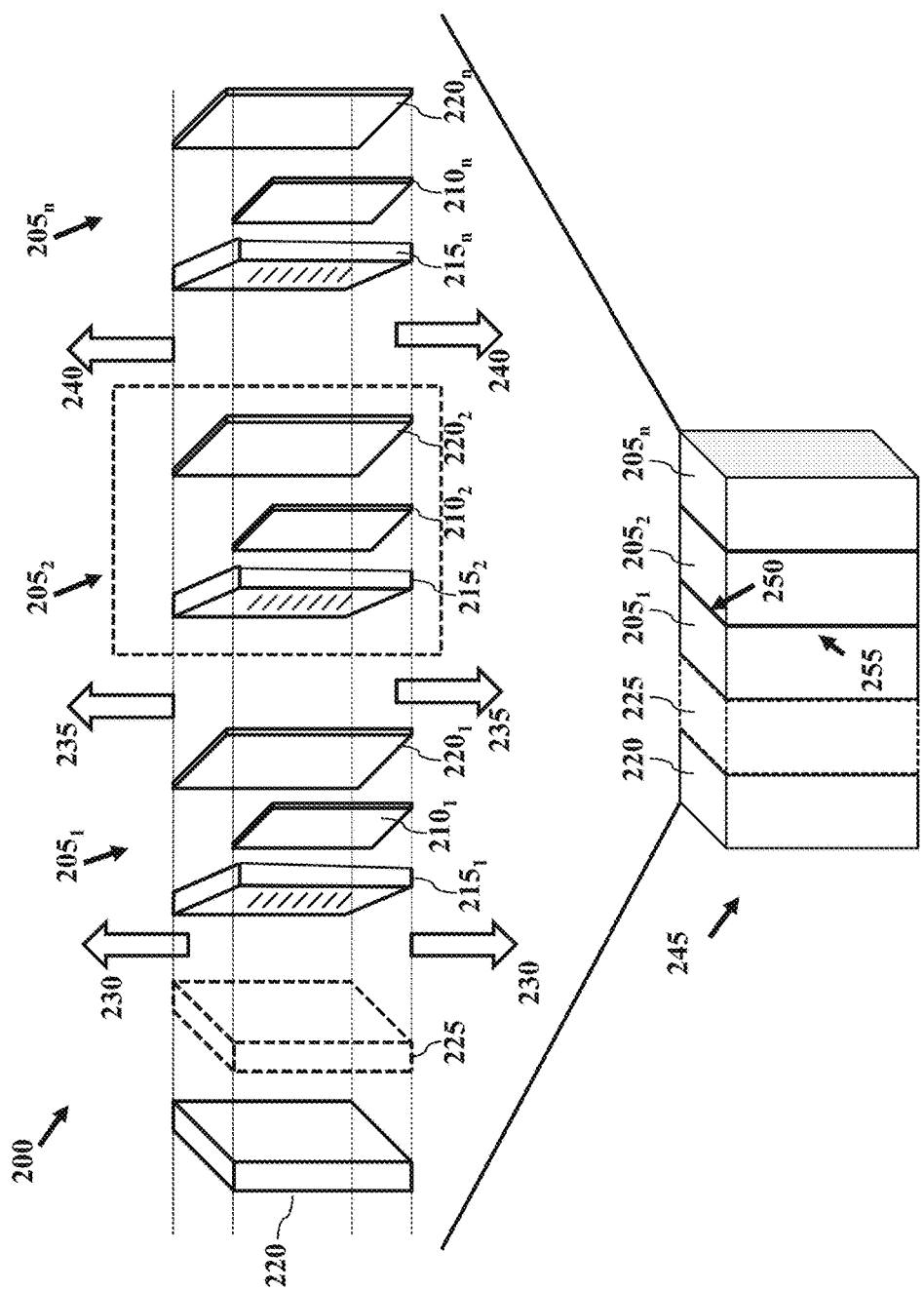
FIG. 2 depicts a simplified diagram of an electronic device according to one or more embodiments.

FIG. 2 depicts a simplified diagram of an electronic device according to one or more embodiments. According to one embodiment, configurations and features are provided for a plurality of modules to improve thermal cooling and shielding of circuit board components associated with each module. FIG. 2 depicts a simplified representation of an electronic device and device features according to one or more embodiments. FIG. 2 depicts both disassembled and assembled representations of an electronic device 200. Electronic device 200 may relate to electronic components for a vehicle, such as a vehicle head unit, vehicle infotainment unit, etc.

According to one embodiment, device 200 includes a series of modules $205_{1-n}$. Modules $205_{1-n}$ may each include a circuit board, shown as circuit boards $210_{1-n}$. According to one embodiment, each of the circuit boards $210_{1-n}$ may be enclosed within a chassis enclosure formed by a front housing and a back housing, such as front housings $210_{1-n}$ and back housings $210_{1-n}$. Device 200 may optionally include main housing 225 configured to support a display 220 and modules $205_{1-n}$. According to one embodiment, circuit boards $210_{1-n}$ may be sized smaller than front housings $210_{1-n}$ and back housings $210_{1-n}$ to allow for enclosing the circuit boards. Each of the front housings $210_{1-n}$ may be paired with one of the back housings $210_{1-n}$ to form a chassis enclosure configured to operate as a Faraday cage to provide EMI shielding for a circuit board retained within the front and back housing. The front housings $210_{1-n}$ and back housings $210_{1-n}$ can include a ground connection along an outer periphery of the housings.

According to one embodiment, front housings $210_{1-n}$ and back housings $210_{1-n}$ may be substantially planar elements to provide a surface area for exchange of heat within air gaps so that heat may be radiated out from electronic device as shown by directions 230, 235 and 240. According to one embodiment, radiation of heat may be provided by air gaps between modules $205_{1-n}$. One benefit of a substantially planar chassis enclosure may be providing an increased surface area to allow for thermal convection in air gaps in comparison to non-modular configurations. According to another embodiment, front housings $210_{1-n}$ and back housings $210_{1-n}$ may also include one or more features, such as raised fins or heat spreaders to radiate heat.

When in use, electronic device 200 may couple modules $205_{1-n}$ to main housing 225 and display 220 as shown by configuration 245. Each chassis enclosure is structurally connected to another chassis enclosure by fastening elements. According to one embodiment, electronic device 200 when assembled in configuration 245 includes air gaps between modules $205_{1-n}$. Air gaps may also be provided between main housing 225 and module $205_1$. Similarly, air gaps may be provided between display 220 and main housing 225. According to one embodiment, air gaps may be on lateral portions, such as left side 255 and/or top and bottom portions, such as top interface 250, of configuration 245. According to one embodiment, each module of electronic device 200 may be separated from each other, with the exception of mounting or coupling points, such that an air gap is provided between each successive pairing of modules $205_{1-n}$. The air gap between modules $205_{1-n}$ may range and vary between each set of modules.

As shown in FIG. 2, each module and chassis enclosure is mounted in a vertical arrangement (e.g., in parallel with display 220). In other embodiments, each chassis enclosure is mounted in a horizontal arrangement (e.g., perpendicular to display 220). Each chassis enclosure may be formed of a heat sinking material and include one or more heat spreading elements of the extending into an air gap between modules.

Figure 3:
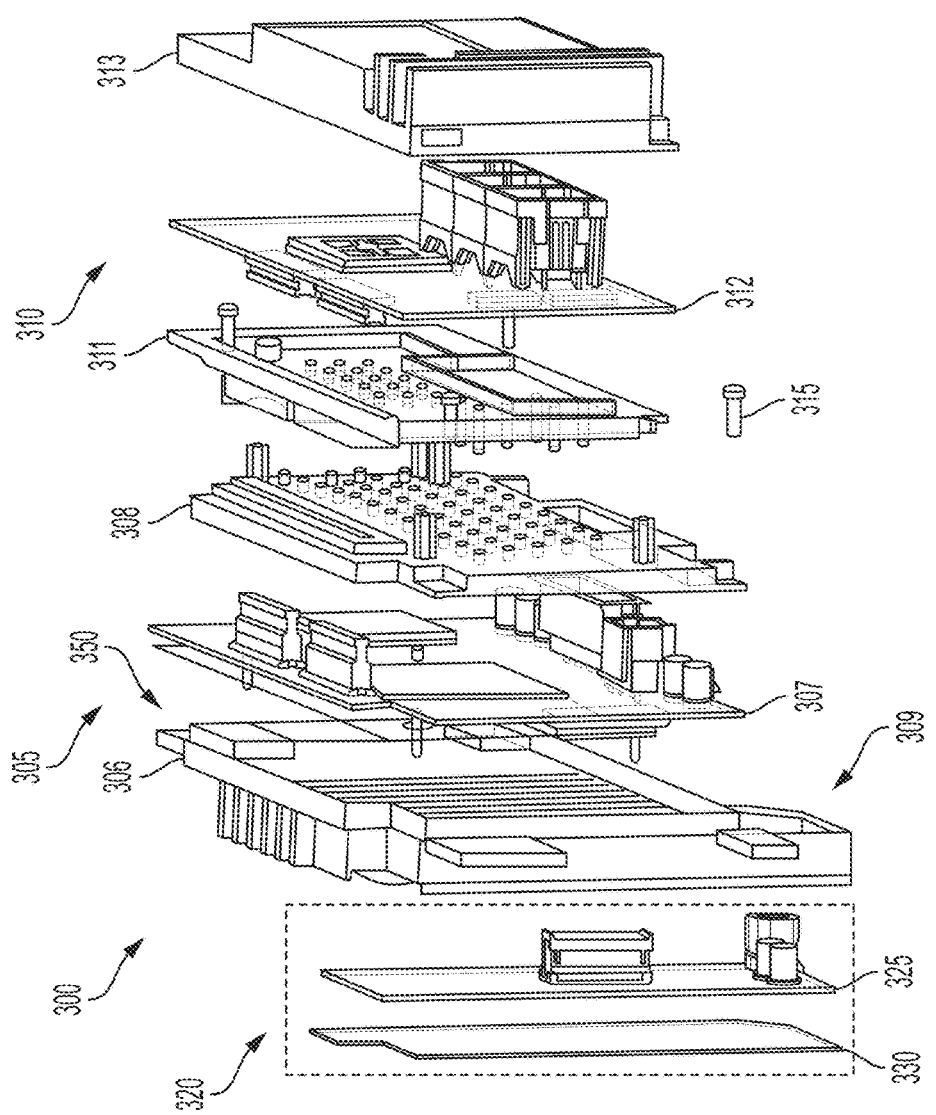
FIG. 3 depicts a graphical representation of an electronic device according to one or more embodiments.

FIG. 3 depicts a graphical representation of an electronic device according to one or more embodiments. In FIG. 3, a disassembled view is shown for electronic device 300 according to one or more embodiments. Electronic device 300 includes module 305 having circuit board 307 and module 310 having circuit board 312. Module 305 includes a chassis enclosure provided by front housing 306 and back housing 308 for circuit board 307. Similarly, module 310 includes a chassis enclosure provided by front housing 311 and back housing 313 for circuit board 312. According to one embodiment, components of modules 305 and 310 may be fastened together to trailing side 309 of front housing 306 by one or more fasteners, such as fastener 315. According to another embodiment, a leading side housing 306 may support optional components 320.

Optional components 320 may relate to circuit board 325 and front cover 330 which may be mounted to front housing 306 to support a display, such as a touch screen display or other components.

According to one embodiment, one or more portions of electronic device 300 may be cooled and/or regulated by liquid cooling elements. Accordingly, electronic device 300 may include one or more liquid cooling features. In one embodiment, embedded channels may be built into circuit boards (e.g., circuit boards 307 and 312) and housings (e.g., front housing 306 and 311 and back housings 308 and 313). In another embodiment, liquid cooling elements of electronic device 300 may be provided by fluid exchange with components such as within the heat spreaders of the housing elements. Electronic device 300 may interface with an ambient exchange element to provide liquid cooling according to one or more embodiments. According to one embodiment, liquid cooling elements of electronic device 300 may include at least one of a passive configuration (e.g., use of a heat pipe, etc.), and active configuration (e.g., use of a pumps and heat exchangers, etc.). Liquid cooling elements may be included within and external to enclosures. For example, one or more of a heat pipe, cold plate, passive system, and active system may additionally circulate heat associated with a module.

According to one embodiment, front housing 306, and one or more other elements of device 300 may include a ground elements. Ground 350 is positioned along an outer perimeter of trailing edge of front housing 306 to provide a ground connection. Each of the modules of device 300, such as front housing 306 and back housing 308 for circuit board 307 and front housing 311 and back housing 313 for circuit board 312, may include a ground element, similar to ground element 350, between the front housing and the back housing of each enclosure to provide a ground connection along an outer periphery of a retained circuit board. According to one embodiment, ground 350 may be provided by one or more ground holes in each circuit board, the ground holes connected to a chassis. Electrical ground connections of modules may also include a contact having a low electrical resistance (e.g., friction contact, fastener, etc.).

While this disclosure has been particularly shown and described with references to exemplary embodiments thereof, it will be understood by those skilled in the art that various changes in form and details may be made therein without departing from the scope of the claimed embodiments.

What is claimed is:

1. An electronic device comprising:
a plurality of circuit boards;
a plurality of chassis enclosures, wherein each of the plurality of circuit boards is separately housed by a respective one of the chassis enclosures, and wherein each of the chassis enclosures includes
a front housing and a back housing, the front housing and back housing configured to retain one of the circuit boards, and
at least one heat dissipation element,
wherein the plurality of chassis enclosures are mounted to provide at least one chassis air gap for heat dissipation between each of the chassis enclosures, and
wherein each chassis of the chassis enclosures shields the retained one of the circuit boards; and
a display, wherein the display is mounted to one of the chassis enclosures, and wherein mounting of the display provides an air gap between the display and the one of the chassis enclosures.

2. The electronic device of claim 1, wherein each of the chassis enclosures is structurally connected to another of the chassis enclosures by fastening elements.

3. The electronic device of claim 1, wherein the front housing and back housing of each of the chassis enclosures is configured to operate as a Faraday cage to provide EMI shielding for the retained one of the circuit boards within the front and back housing.

4. The electronic device of claim 1, wherein the front housing and the back housing of each of the chassis enclosures includes a ground connection along an outer periphery of the retained one of the circuit.

5. The electronic device of claim 1, wherein each of the chassis enclosures is mounted in at least one of a vertical arrangement or horizontal arrangement.

6. The electronic device of claim 1, wherein each of the chassis enclosures is formed of a heat sinking material and wherein one or more of the at least one heat dissipation elements of each of the chassis enclosures extends into the at least one chassis air gap between the chassis enclosures.

7. The electronic device of claim 1, wherein the electronic device is a head unit for a vehicle and the circuit boards of the electronic device are modules for at least one of a media player, a navigation unit, a radio, a communications unit or vehicle interface unit.

8. The electronic device of claim 1, further comprising a liquid cooled element for at least one of the chassis enclosures.

9. The electronic device of claim 1, further comprising a main chassis element including a first side structurally connected to the one of the plurality of chassis enclosures and a second side structurally supporting the display, wherein the main chassis element provides shielding of at least one of heat or electromagnetic interference.

10. An electronic device comprising:
a display;
a plurality of circuit boards;
a main chassis element configured to support the display; and
a plurality of chassis enclosures, wherein each of the plurality of circuit boards is separately housed by a respective one of the chassis enclosures, and wherein each of the chassis enclosures includes
a front housing and a back housing, the front housing and back housing configured to retain one of the circuit boards, and
at least one heat dissipation element,
wherein the plurality of chassis enclosures are mounted to provide at least one chassis air gap for heat dissipation between each of the chassis enclosures,
wherein each chassis of the chassis enclosures shields the retained one of the circuit boards,
wherein the display is mounted to one of the chassis enclosures, and
wherein mounting of the display provides an air gap between the display and the one of the chassis enclosures.

11. The electronic device of claim 10, wherein each of the chassis enclosures is structurally connected to another of the chassis enclosures by fastening elements.

12. The electronic device of claim 10, wherein the front housing and back housing of each of the chassis enclosures is configured to operate as a Faraday cage to provide EMI shielding.

13. The electronic device of claim 10, wherein the front housing and the back housing of each of the chassis enclosures includes a ground connection along an outer periphery of the retained one of the circuit.

14. The electronic device of claim 10, wherein each of the chassis enclosures is mounted in at least one of a vertical arrangement or horizontal arrangement.

15. The electronic device of claim 10, wherein each of the chassis enclosures is formed of a heat sinking material and wherein one or more of the at least one heat dissipation elements of each of the chassis enclosures extends into the at least one chassis air gap between the chassis enclosures.

16. The electronic device of claim 10, wherein the electronic device is a head unit for a vehicle and the circuit boards of the electronic device are modules for at least one of a media player, a navigation unit, a radio, a communications unit or vehicle interface unit.

17. The electronic device of claim 10, wherein the display is a touch screen display configured for operation by at least one of the plurality of circuit boards.

18. The electronic device of claim 10, further comprising a liquid cooled element for at least one of the chassis enclosures.

19. The electronic device of claim 10, wherein the main chassis element includes a first side structurally connected to the plurality of chassis enclosures and a second side structurally supporting the display.

* * * * *